(12) United States Patent
Hirota

(10) Patent No.: US 7,514,176 B2
(45) Date of Patent: Apr. 7, 2009

(54) BATTERY HAVING A MOLDED RESIN PORTION

(75) Inventor: Hiroyuki Hirota, Yokohama (JP)

(73) Assignee: Kyocera Corporation, Kyoto (JP)

( * ) Notice: Subject to any disclaimer, the term of this patent is extended or adjusted under 35 U.S.C. 154(b) by 543 days.

(21) Appl. No.: 10/810,212

(22) Filed: Mar. 26, 2004

(65) Prior Publication Data
US 2004/0191616 A1 Sep. 30, 2004

(30) Foreign Application Priority Data
Mar. 28, 2003 (JP) .............................. 2003-089905

(51) Int. Cl.
H01M 2/06 (2006.01)
H01M 2/08 (2006.01)

(52) U.S. Cl. ....................... 429/179; 429/184
(58) Field of Classification Search ................. 429/179, 429/184
See application file for complete search history.

(56) References Cited

FOREIGN PATENT DOCUMENTS

| JP | 2002-190287 | | | 7/2002 |
|----|----|----|----|----|
| JP | 2002-260615 | | | 9/2002 |
| JP | 2002260615 | A | * | 9/2002 |
| JP | 2002260621 | A | * | 9/2002 |
| JP | 2002334686 | A | * | 11/2002 |
| JP | 2003-017016 | | | 1/2003 |
| JP | 2003-077436 | | | 3/2003 |

\* cited by examiner

*Primary Examiner*—Tracy Dove
(74) *Attorney, Agent, or Firm*—Hogan & Hartson LLP

(57) ABSTRACT

A battery includes a battery cell having a pair of terminals, a circuit board disposed on a side of the battery cell, a pair of connecting members, one end of each connecting member being attached to a respective end of the circuit board, and the other end of each connecting member being attached to the respective terminal of the battery cell, a connector having a resin path, the connector provided on the circuit board, and a molded resin portion continuously formed via the resin path, covering the circuit board and the connecting members disposed on the battery cell.

3 Claims, 3 Drawing Sheets

BATTERY HAVING A MOLDED RESIN PORTION

BACKGROUND OF THE INVENTION

1. Field of the Invention

The present invention relates to a battery, in which a circuit board disposed on a battery cell is continuously covered by a molded resin portion, and a method for manufacturing the battery.

Priority is claimed on Japanese Patent Application No. 2003-89905, filed Mar. 28, 2003, the content of which is incorporated herein by reference.

2. Description of Related Art

A conventional battery that is mounted in a portable mobile terminal device such as personal telephone or personal digital assistants (PDA) includes a battery cell, a circuit board, which electronic components for controlling battery recharging and electrical protection are mounted on, connecting members for electrically connecting terminals of the battery to the circuit board, and a connector for connecting to the mobile terminal device, as is shown, for example, in Japanese Unexamined Patent Application, First Publication No. 2002-260615. In recent years, there is a demand for smaller batteries to allow further miniaturization of mobile terminal devices.

Accordingly, recently there has been produced a battery in which a molded resin portion continuously secures the battery cell, the circuit board, the connecting members and the connector; the battery being miniaturized by reducing the size of the molded resin portion.

That is, a circuit board is disposed on a narrow side face of a thin rectangular battery cell, and the connecting members are disposed on the side face and on narrow side faces adjacent thereto. A connector having the same width as the circuit board is secured on the top face of the circuit board. Consequently, the sections for forming the molded resin portion are restricted to the side and end faces of the battery cell, enabling the battery to be made smaller.

However, the conventional battery described above has a drawback in that, since the molded resin portions are formed separately on either side of the connector, resin must be poured separately into each region when forming the molded resin portions, making the manufacturing efficiency of the battery poor.

Furthermore, since the regions (cavities) where the molded resin portions are formed are defined by a metal mold and the connector, when the resin that was poured into the cavities from resin pouring grooves has reached the connector, it is apprehended that the resin may stick to the top face of the connector, i.e. to the external connecting terminal.

Resin sticking to the external connecting terminal may cause poor electrical contact between the external connecting terminal and the mobile terminal device, and for this reason the resin must be removed after the molded resin portion has been formed; this further reduces the manufacturing efficiency of the battery.

This invention has been realized after consideration of the circumstances above, and aims to provide a battery with increased manufacturing efficiency and a method for manufacturing the battery.

SUMMARY OF THE INVENTION

In order to achieve the above objects, the first aspect of this invention provides a battery having a battery cell having a pair of terminals, a circuit board disposed on a side of the battery cell, a pair of connecting members, one end of each connecting member being attached to a respective end of the circuit board, and the other end of each connecting member being attached to the respective terminal of the battery cell, a connector having a resin path, the connector provided on the circuit board, and a molded resin portion continuously formed via the resin path, covering the circuit board and the connecting members disposed on the battery cell.

According to the first aspect, to form the molded resin portion, resin is supplied into one of two cavities divided by the connector between the metal mold and the battery cell, and flows along the resin path to the other cavity, enabling the molded resin portion to be formed by supplying resin once only; furthermore, since the molded resin portion continuously covers the connector, the strength of attachment to the battery cell can be increased.

Since the resin is supplied via the resin path of the connector, the resin can be prevented from sticking to the external connecting terminal exposed at the top face of the connector.

It is desirable that the battery cell be rectangular, one of the pair of terminals protrude from one of the side provided with the circuit board and a side not provided with the circuit board on the battery cell, and the other of the pair of terminals be a location on the battery cell except at an the location at which the one of the pair of terminals is disposed.

In addition, it is desirable that the battery further including an insulating layer between the connecting member to which one of the pair of terminals is connected and the battery cell.

It is desirable that the connector include a terminal housing arranged on the circuit board, and an external connecting terminal connected to the circuit board electrically, and the external connecting terminal is arranged on top of the terminal housing.

It is desirable that one end of the external connecting terminal be exposed at a side of the terminal housing.

The second aspect of this invention provides a battery manufacturing method including the steps of preparing a battery cell and a circuit board, mounting a connector having a resin path onto the circuit board; forming a battery unit by fixing the circuit board on which the connector is mounted on a side of the battery cell and electrically connecting the circuit board and terminals of the battery cell by connecting members, arranging the battery unit in a metal mold and forming two cavities divided by the connector, supplying soft resin via a resin inlet, which opens to one of the two cavities, to the two cavities mutually connected by the resin path of the connector; and attaching a molded resin portion to the battery cell for covering the circuit board and the connecting members by hardening the resin.

According to the second aspect of this invention, at the time of supplying the resin from the resin inlet to the cavities, since resin that was supplied to one cavity flows along the resin path and reaches the other cavity, only one resin inlet need be provided for supplying the resin to one cavity, whereby both cavities can be filled with resin and the molded resin portion can be formed in a single piece. In other words, resin need only be supplied once to form the molded resin portion.

Furthermore, since the resin can be fed along the resin path, it can be prevented from sticking to the external connecting terminal exposed on the top face of the connector.

It is desirable that the resin inlet be arranged on a portion such that distances between the resin inlet and each end of the two cavities are equal.

DETAILED DESCRIPTION OF THE INVENTION

Figure 1:
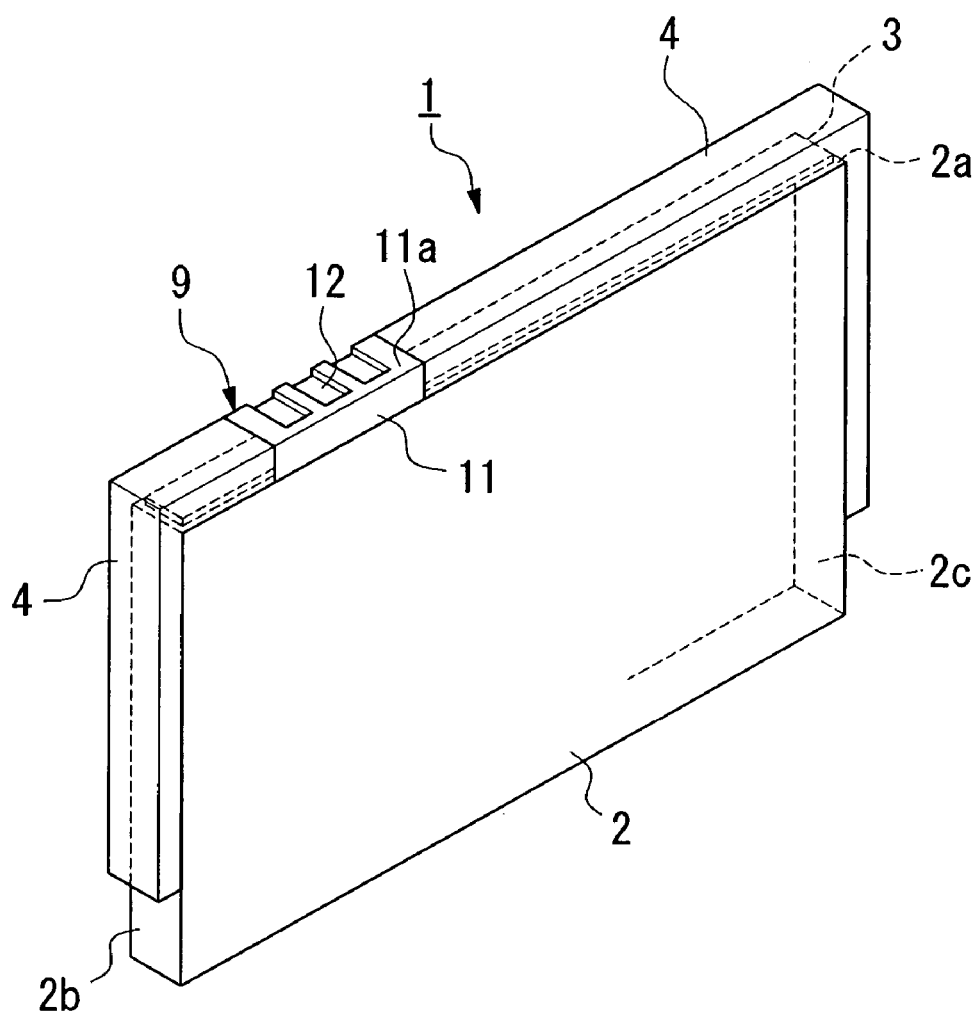
FIG. 1 is a perspective view of a battery according to an embodiment of this invention.

FIGS. 1 to 4 show a preferred embodiment of this invention. As shown in FIG. 1, a battery 1 according to this embodiment includes a rectangular plate type battery cell 2, a circuit board 3 that is disposed along a narrow side (one side) 2a of the battery cell 2 parallel to its thickness, and a molded resin portion 4 enclosing the circuit board 3, the molded resin portion 4 covering side 2a of the battery cell 2 and sides (other sides) 2b and 2c adjacent to side 2a.

Figure 2:
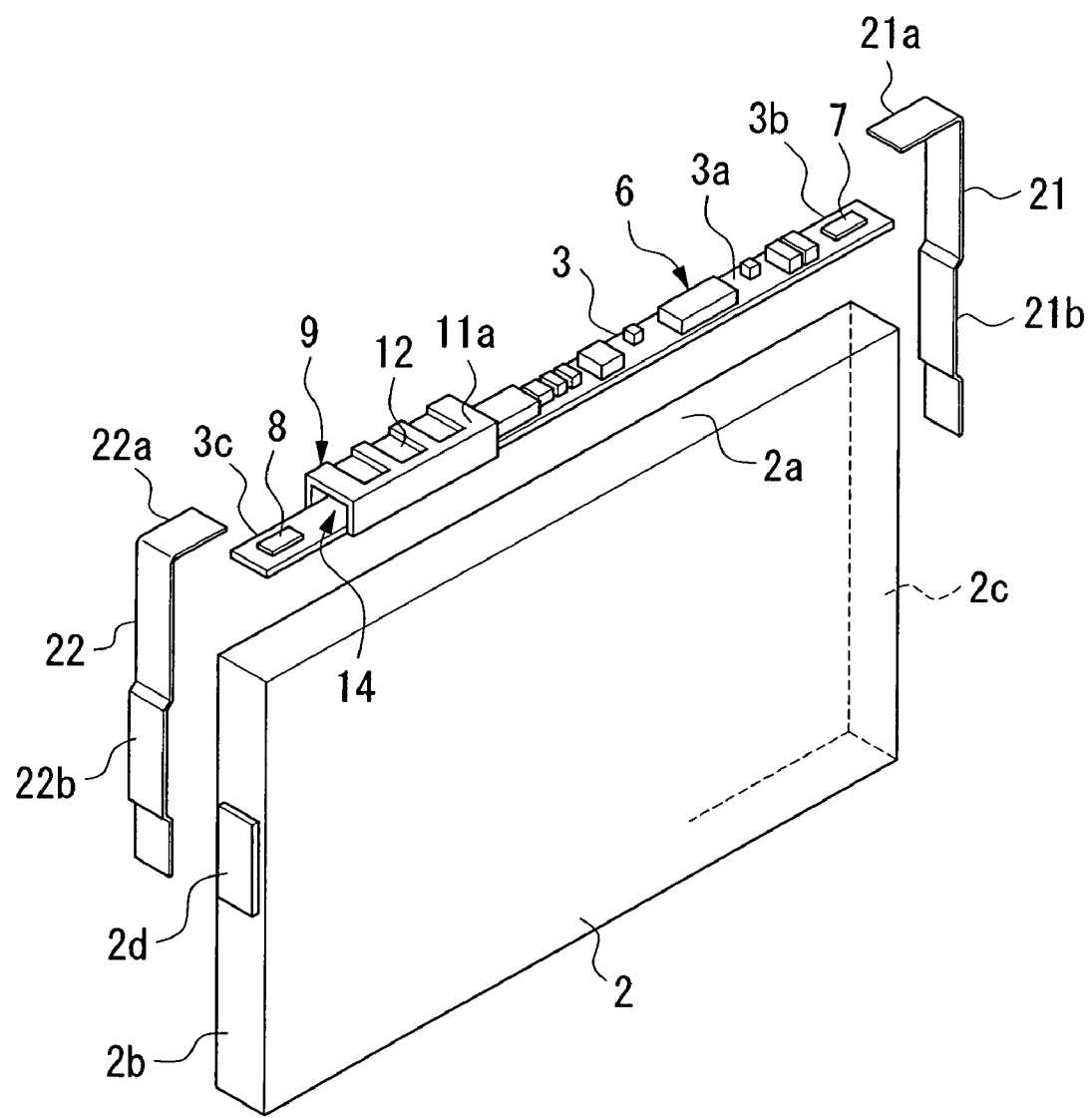
FIG. 2 is a perspective view of the battery in FIG. 1 when a molded resin portion has been removed therefrom, and a battery cell, a circuit board, a positive electrode connecting plate and a negative electrode connecting plate are illustrated in an exploded arrangement.

The battery cell 2 includes a separator, electrodes, and electrolytic fluid, encapsulated in a rectangular plate type receptacle of aluminum alloy or the like. As shown in FIG. 2, a negative electrode terminal (electrode terminal) 2d protrudes from the central section of side 2b of the battery cell 2, and a positive electrode terminal (electrode terminal) covers the top face of the battery cell 2 excepting the negative electrode terminal 2d. An unillustrated insulating resin sheet is pasted over the side 2b excepting the negative electrode terminal 2d.

On the top face 3a of the circuit board 3, a plurality of electronic components 6 for preventing excess current and controlling recharging of the battery cell 2, land sections 7 and 8 for electrically connecting to each of the terminals of the battery cell 2, and a connector 9 for electrically connecting to an unillustrated mobile terminal device are disposed.

The land section 7 and 8 are provided at respective terminal points 3b and 3c in the long direction of the circuit board 3. The connector 9 includes an approximately rectangular parallelepiped terminal housing 11, and an external connecting terminal 12, which is exposed to the outside from the top side 11a of the terminal housing 11.

With the connector 9 attached to the circuit board 3, the external connecting terminal 12 is spot welded or soldered to the circuit board 3 so as to be electrically connected thereto. As shown in FIG. 1, the external connecting terminal 12 is exposed to the outside of the molded resin portion 4.

Figure 3:
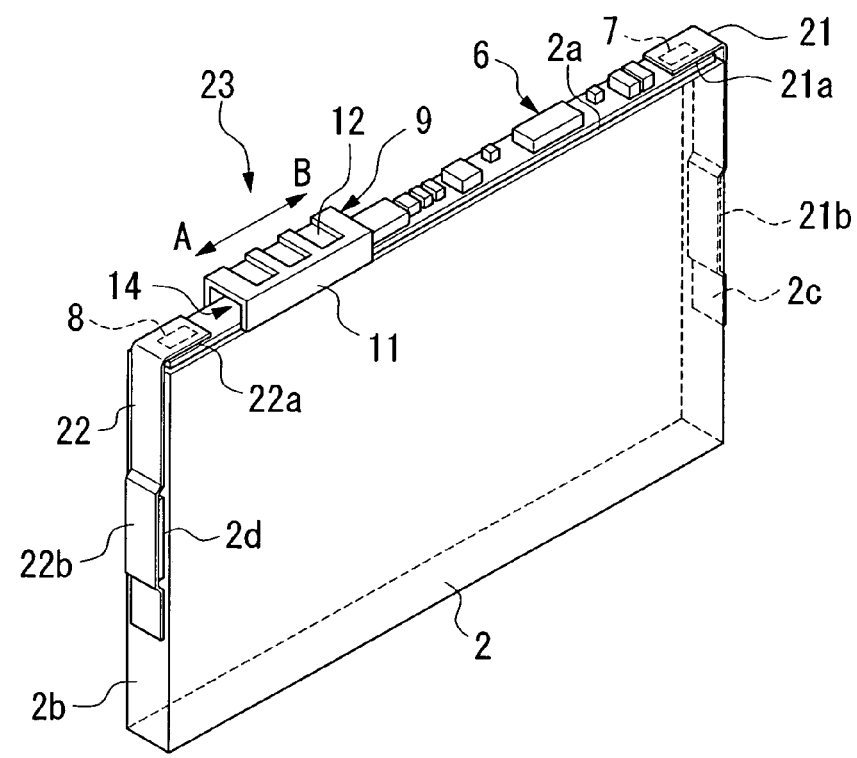
FIG. 3 is a perspective view of the battery in FIG. 1, showing the state prior to forming the molded resin portion.
Figure 4:
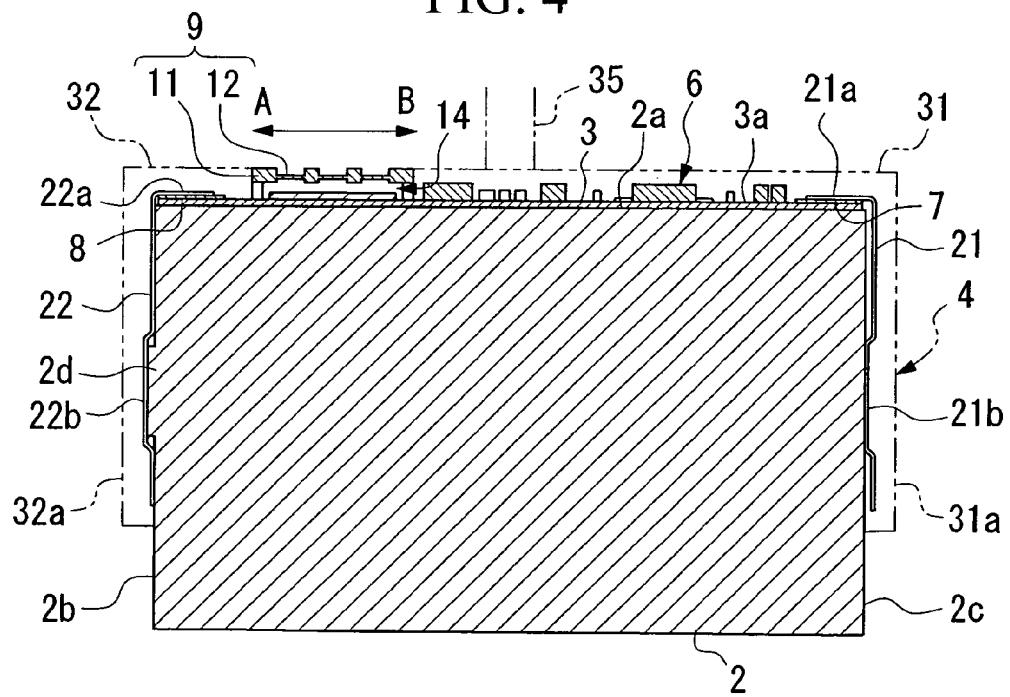
FIG. 4 is a cross-sectional view of the battery in FIG. 1, showing the state prior to forming the molded resin portion.

As shown in FIGS. 3 and 4, the terminal housing 11 has the same width as the sides 2a to 2c of the battery cell 2. With the connector 9 attached to the circuit board 3, the terminal housing 11 forms a resin path 14 that passes along the long direction (AB direction) of the side 2a of the battery cell 2.

Incidentally, the connector 9 is joined in a single piece to the external connecting terminal 12 and the terminal housing 11 by insert molding, and the external connecting terminal 12 exposed on the top side 11a of the terminal housing 11 is arranged in parallel with the side 2a of the battery cell 2.

As described above, the electronic components 6 and the connector 9 are secured on the circuit board 3, which is electrically connected to the battery cell 2 via the positive electrode connecting plate (connecting member) 21 and the negative electrode connecting plate (connecting member) 22. As shown in FIG. 2, the positive electrode connecting plate 21 and the negative electrode connecting plate 22 are comprised of L-shaped metal plates, such as nickel plates, whose widths are narrower than the thickness of the battery cell 2.

The positive electrode connecting plate 21 is arranged along the sides 2a and 2c of the battery cell 2, and one end section 21a is connected to the land section 7 by spot welding or soldering. The other end section 21b of the positive electrode connecting plate 21 is connected by spot welding or soldering to the side 2c of the battery cell 2 that will become the positive electrode terminal.

The negative electrode connecting plate 22 is arranged along the sides 2a and 2b of the battery cell 2, and one end section 22a is connected to the land section 8 by spot welding or soldering. The other end section 22b of the negative electrode connecting plate 22 is connected by spot welding or soldering to the negative electrode terminal 2d that protrudes from the side 2b of the battery cell 2. Since an insulating resin sheet is provided between the negative electrode connecting plate 22 and the side 2b of the battery cell 2, the negative electrode connecting plate 22 is electrically insulated from the side 2b.

The positive electrode connecting plate 21 and the negative electrode connecting plate 22 can be extracted from the battery cell 2 and the external connecting terminal 12 respectively to an unillustrated mobile terminal device.

The molded resin portion 4 covers the circuit board 3, the positive electrode connecting plate 21, and the negative electrode connecting plate 22, and is attached to the battery cell 2. Viewed from the outside, the molded resin portion 4 appears to be divided by the connector 9 midway along the long direction of the side 2a of the battery cell 2, but in fact it is formed continuously via the resin path 14 described earlier.

A manufacturing method of the battery 1 having the above constitution will be explained.

Firstly, the electronic components 6, the land sections 7 and 8, and the connector 9 are mounted onto the top face 3a of the circuit board 3 as shown in FIG. 2. Next, the circuit board 3 is pasted to the side 2a of the battery cell 2 by an unillustrated adhesive sheet. Then, the ends 21a and 21b of the positive electrode connecting plate 21 are spot welded or soldered respectively to the land section 7 and the side 2c that will form the positive electrode terminal, and the ends 22a and 22b of the negative electrode connecting plate 22 spot welded or soldered respectively to the land section 8 and the negative electrode terminal 2d, forming a battery unit 23, as shown in FIG. 3.

Thereafter, the battery unit 23 is arranged in an unillustrated metal mold and soft resin is supplied into cavities 31 and 32, which are defined by the metal mold, the battery cell 2, and the connector 9, as shown in FIG. 4.

That is, with the battery unit 23 arranged in the metal mold, the two cavities 31 and 32 divided by the connector 9 are formed, and are mutually connected by the resin path 14. The two cavities 31 and 32 constitute a region for forming the molded resin portion 4.

The soft resin is supplied from a gate (resin inlet) 35, which is provided in the metal mold and opens to one of the two cavities (cavity 31), into the cavity 31. At the time of supplying the resin, the resin that was supplied into the cavity 31 flows along the resin path 14 in the A direction until it reaches the other cavity (cavity 32). As a result, the resin fills both cavities 31 and 32, encapsulates the circuit board 3, the electronic components 6, the positive electrode connecting plate 21, and the negative electrode connecting plate 22, and covers the sides 2a to 2c of the battery cell 2. The gate 35 should preferably be provided so that the distances to the respective reach ends 31a and 32a from the cavities 31 and 32 are equal.

Finally, the resin is hardened to form the molded resin portion 4, which is attached to the battery cell 2 and covers the circuit board 3, the positive electrode connecting plate 21 and the negative electrode connecting plate 22. Then, the manufacture of the battery 1 shown in FIG. 1 is completed.

According to the battery 1 and the manufacturing method of the battery 1 described above, the resin path 14 is provided between the connector 9 and the circuit board 3, and resin is supplied from the gate, which is provided in the metal mold and opens to one cavity 31, into the cavity 31. By these simple steps, the molded resin portion 4 can be formed by filling the cavities 31 and 32 with the resin, increasing the manufacturing efficiency of the battery 1.

Further, since only one gate 35 need be provided in the metal mold, the metal mold is easier to manufacture, enabling the manufacturing cost of the battery 1 to be reduced.

Moreover, since the resin can be fed into the resin path 14 at the time of supplying resin to the cavity 31, it is possible to prevent the resin from sticking to the external connecting terminal 12, which is exposed at the top face 11a of the terminal housing 11.

In addition, since the molded resin portion 4 is formed continuously from resin filled in the resin path 14, the strength of attachment to the battery cell 2 can be increased.

In the embodiment described above, the resin path 14 was formed with the terminal housing 11 attached to the circuit board 3, but there are no restrictions on this arrangement, it being acceptable to form a through hole in the terminal housing 11 along the AB direction beforehand and use this through hole as the resin path.

An insulating sheet is inserted between the negative electrode connecting plate 22 and the side 2b of the battery cell 2, but there is no restriction on this, and it is acceptable to provided an insulating gap between the negative electrode connecting plate 22 and the top face of the battery cell 2 excepting the negative electrode terminal 2d.

In the embodiment described above, the positive electrode connecting plate 21 and the negative electrode connecting plate 22 electrically connect the battery cell 2 to the circuit board 3, but there is no restriction on this arrangement, it being acceptable to connect the battery cell 2 to the circuit board 3 by using lead wires, for example.

The specific constitution of this invention is not restricted to the embodiment that has been described with reference to the drawings, and may be modified in various ways without deviating from the main features of the invention.

What is claimed is:

1. A battery comprising:
    a battery cell having a pair of terminals;
    a circuit board disposed on a side of the battery cell;
    a pair of connecting members, one end of each connecting member being attached to a respective end of the circuit board, and the other end of each connecting member being attached to the respective terminal of the battery cell;
    a connector having a resin path extending therethrough along the side of the battery cell, wherein the connector is provided on the circuit board, the resin path is provided between the connector and the circuit board, and a width of the connector is substantially the same as a width of the side of the battery cell; and
    a molded resin portion continuously formed via the resin path, covering the circuit board and the connecting members disposed on the battery cell.

2. A battery according to claim 1,
    wherein the connector comprises
    a terminal housing arranged on the circuit board; and
    an external connecting terminal connected to the circuit board electrically, and wherein the external connecting terminal is arranged on top of the terminal housing.

3. A battery according to claim 2, wherein one end of the external connecting terminal is exposed at a side of the terminal housing.

* * * * *